(12) United States Patent
Faroudja (10) Patent No.: US 9,923,646 B1
(45) Date of Patent: Mar. 20, 2018

(54) COMBINATION LOW-PASS FILTER

(71) Applicant: Yves Faroudja, Los Altos, CA (US)

(72) Inventor: Yves Faroudja, Los Altos, CA (US)

( * ) Notice: Subject to any disclaimer, the term of this patent is extended or adjusted under 35 U.S.C. 154(b) by 0 days.

(21) Appl. No.: 15/637,787

(22) Filed: Jun. 29, 2017

(51) Int. Cl.
  *H04B 1/66* (2006.01)
  *H04B 14/04* (2006.01)
  *H03H 17/04* (2006.01)
  *H04N 19/90* (2014.01)
  *H03M 7/30* (2006.01)

(52) U.S. Cl.
  CPC ....... *H04B 14/046* (2013.01); *H03H 17/0416* (2013.01); *H03M 7/3053* (2013.01); *H04B 1/66* (2013.01); *H04N 19/90* (2014.11)

(58) Field of Classification Search
  CPC .... H04B 1/66; H04B 14/046; H04B 17/0416; H04N 19/90; H04N 5/21; H03M 7/3053
  See application file for complete search history.

(56) References Cited

U.S. PATENT DOCUMENTS

| | | | | |
|---|---|---|---|---|
| 4,939,576 A | * | 7/1990 | Campbell | H04N 5/208 348/607 |
| 5,193,222 A | * | 3/1993 | Sasaki | H04L 27/0008 455/102 |
| 5,291,280 A | * | 3/1994 | Faroudja | H04N 5/144 348/447 |
| 2006/0013413 A1 | * | 1/2006 | Sakaidani | H03G 3/348 381/104 |
| 2010/0066442 A1 | * | 3/2010 | Mu | H03H 11/1291 327/553 |

* cited by examiner

*Primary Examiner* — Khanh C Tran
(74) *Attorney, Agent, or Firm* — Schwabe Williamson & Wyatt, PC (57) ABSTRACT

A combination low-pass filter and a method for reducing bandwidth of an input signal comprises filtering an input signal in parallel with a first type of low-pass filter to produce a first filtered signal having the first type of artifacts, and a second low-pass filter to produce a second filtered signal that does not include the first type of artifacts. Responsive to detecting no significant transition in the input signal, the first filtered signal is output. And responsive to detecting a significant transition in the input signal, portions of the first filtered signal are selectively replaced with portions of the second filtered signal by switching outputs from the first filtered signal to the second filtered signal in transition zones occurring immediately before and immediately after the detected transition in the input signal, wherein the transition zones overlap duration of the first type of artifacts caused by the first filter.

20 Claims, 6 Drawing Sheets

COMBINATION LOW-PASS FILTER

BACKGROUND

Low pass filters are used in all branches of signal processing (video, audio, data, etc.). Their function is to pass a package of wave energy from zero frequency up to a determined cut-off frequency and reject all energy beyond this limit. An ideal low-pass filter is one that passes, without attenuation, all frequencies below the cut-off frequencies while providing infinite attenuation above the cut-off frequencies.

Figure 1A:
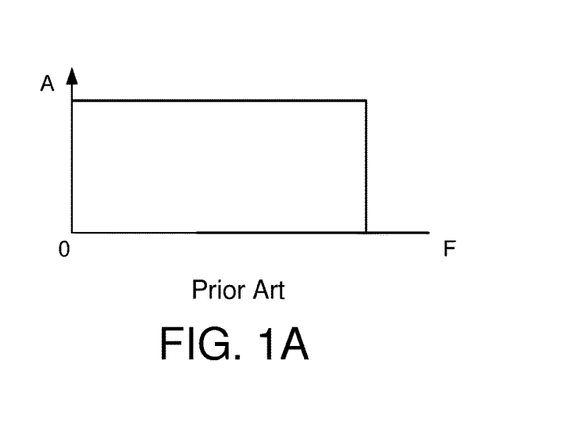
FIG. 1A is a frequency domain representation of a portion of a conventional input signal.

FIG. 1A is a frequency domain representation of a portion of a conventional input signal where a sharp transition occurs, where the x-axis represent frequency and the y-axis represents amplitude. For many applications, the input signal may be bandwidth reduced using some type of low-pass filter. However, depending on their structure, low-pass filters may react differently during the processing of a very sharp transition in the input signal, e.g., an abrupt change between black and white. For the sake of simplicity, the example signal shown is limited to video applications, but this discussion is equally applicable to all other signal sources.

Figure 1B:
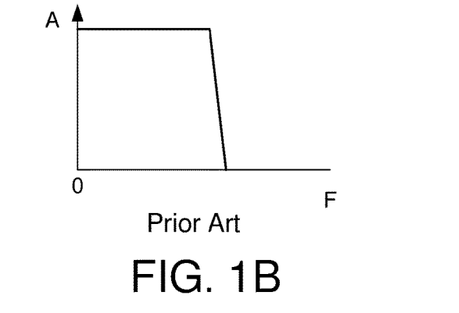
FIG. 1B is a frequency domain representation of the output of an ideal Brickwall-type low-pass filter.
Figure 1C:
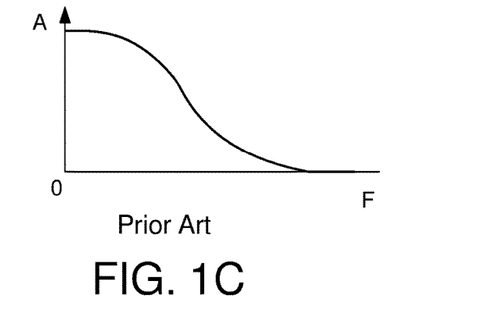
FIG. 1C is a frequency domain representation of a conventional Gaussian-type low-pass filter whose output has a gradual cutoff slope.

In practice, no filter is ideal. All categories of low pass filters give a choice between a fast cut-off between low and high frequencies. Some low pass filters are designed with a steep cutoff slope that resembles a "Brickwall," FIG. 1B is a frequency domain representation of the output of an ideal Brickwall-type low-pass filter, where the x-axis represent frequency and the y-axis represents frequency. Another type of low-pass filter, such as a Gaussian filter, may produce an output signal during a very sharp transition that has a more progressive variation of amplitude between high and low frequencies. FIG. 1C is a frequency domain representation of a conventional Gaussian-type low-pass filter whose output has a gradual cutoff slope.

Unfortunately, both types of low pass filters (including other filters having the same family of responses as Brickwall filters and Gaussian filters) present artifacts or defects, particularly in the time domain in video and audio signal examples.

Figure 1D:
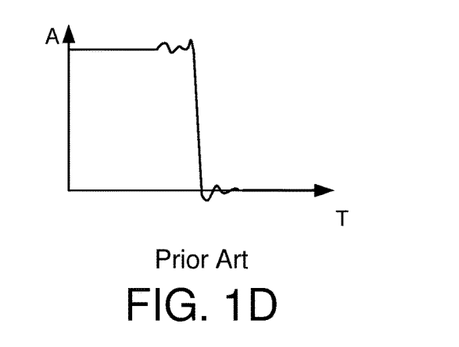
FIG. 1D is a time domain representation of the output of the ideal Brickwall-type low-pass filter after processing the input signal of FIG. 1A.
Figure 1E:
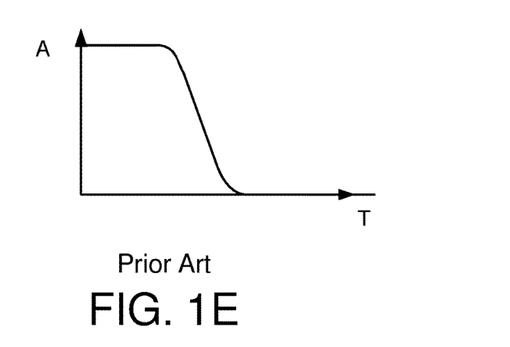
FIG. 1E is a time domain representation of the conventional Gaussian-type low-pass filter after processing the signal of FIG. 1A.

For example, Brickwall-type filters are known to generate excessive ringing on either side of large amplitude transitions, which is detrimental to image appearance. FIG. 1D is a time domain representation of the output of the ideal Brickwall-type low-pass filter after processing the signal of FIG. 1A, where the x-axis represent frequency and the y-axis represents time. The time domain representation shows that an advantage of the Brickwall-type filter is that it produces a very quick change between low frequencies (preserved) and high frequencies (efficiently reduced or eliminated). The inconvenience is that due to the impulse response function of the Brickwall filter, the Brickwall filter produces time domain artifacts called "ringing" in the vicinity of the cutoff area, i.e., on either side of the transition in the input signal. In the output video signal, the transitions are sharp and deliver an apparent high resolution. However, the sharp edges are surrounded by a series of "echoes" (ringing), which appear to be attenuated repetition of the sharp edges. The other family of filters, such as Gaussian filters, do not present such inconvenient ringing artifacts, but produce other problems. FIG. 1E is a frequency domain representation of a conventional Gaussian-type low-pass filter after processing the signal of FIG. 1A. The high frequencies are not sufficiently attenuated (which leads to undesirable artifacts with further processing) and, in video for example, a sudden transition in the input signal is expanded in time in the output signal (FIG. 1E), which makes the image appear to be out of focus in the vicinity of the transition.

Accordingly, there is a need for an improved low-pass filter for reducing the bandwidth of an input signal. The present invention addresses such a need.

BRIEF SUMMARY

The exemplary embodiment provides a combination low-pass filter for reducing bandwidth of an input signal. Aspects of exemplary embodiment include filtering an input signal in parallel with a first type of low-pass filter to produce a first filtered signal having the first type of artifacts, and a second type of low-pass filter to produce a second filtered signal that does not include the first type of artifacts. Responsive to detecting no significant transition in the input signal, the first filtered signal is output. And responsive to detecting a significant transition in the input signal, portions of the first filtered signal are selectively replaced with portions of the second filtered signal by switching outputs from the first filtered signal to the second filtered signal in transition zones occurring immediately before and immediately after the detected transition in the input signal, wherein the transition zones overlap duration of the first type of artifacts caused by the first filter.

According to the method and system disclosed herein, the exemplary embodiments combine characteristics of a Brickwall-type low-pass filter and a Gaussian-type low-pass filter by switching between outputs of the Brickwall-type low-pass filter and the Gaussian-type low-pass filter in the presence of transitions.

DETAILED DESCRIPTION

The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments provide a combination low-pass filter for reducing the bandwidth of an input signal, which combines the best features of a Brickwall and Gaussian types of filters, but without their drawbacks. The combination low-pass filter uses both types of filters in a novel configuration in order to eliminate their inconveniences (ringing, non-negligible high frequencies, attenuation of the lows) while keeping their useful features (fast transitions, no ringing, no significant high frequencies). In one embodiment, the combination low-pass filter significantly reduces artifacts in an output signal by selectively switching between outputs of a Brickwall-type filter and a Gaussian-type filter in the presence of transitions detected in the input signal. At transitions, the final output signal has significantly reduced or no ringing artifacts, but has fast (minimal duration) rise times and roll-off characteristics.

Figure 2:
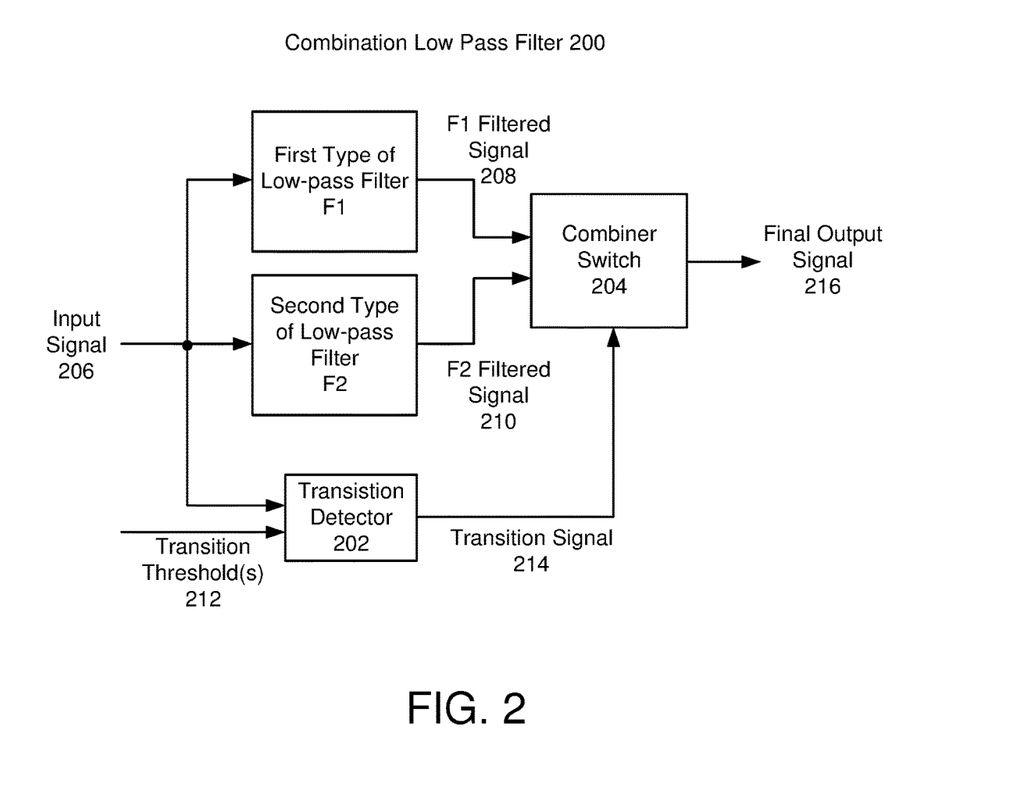
FIG. 2 is a block diagram illustrating a combination low pass filter for reducing bandwidth of an input signal that significantly reduces artifacts in an output signal according to an exemplary embodiment.

FIG. 2 is a block diagram illustrating a combination low pass filter for reducing bandwidth of an input signal that significantly reduces artifacts in an output signal according to an exemplary embodiment. In one embodiment, the combination low pass filter 200 may comprise a first type of low-pass filter F1, a second type of low-pass filter F2, a transition detector 202, and a combiner switch 204. Filters F1 and F2 process an input signal 206 separately to produce an F1 filtered signal 208 and an F2 filtered signal 210, respectively. In one embodiment, the first type of low-pass filter F1 may comprise a Brickwall-type low-pass filter, while the second type of low-pass filter F2 may comprise a Gaussian-type low-pass filter, although other combinations of different types of low-pass filters may be used.

As used herein, a low-pass filter passes signals with a frequency lower than a certain cutoff frequency and attenuates signals with frequencies higher than the cutoff frequency. The term "Brickwall-type low-pass filter" means a low-pass filter that passes a signal that creates one type of artifacts, i.e., ringing, around transitions in the input signal, while the term "Gaussian-type low-pass filter" means a low-pass filter that passes a signal that does create artifacts around transitions in the input signal. According to the exemplary embodiment, the combiner switch 204 reduces the bandwidth of the input signal by selectively switching between outputs of the Brickwall-type low-pass filter and the Gaussian-type low-pass filter to generate the final output signal 216 having significantly reduced artifacts.

Figure 3:
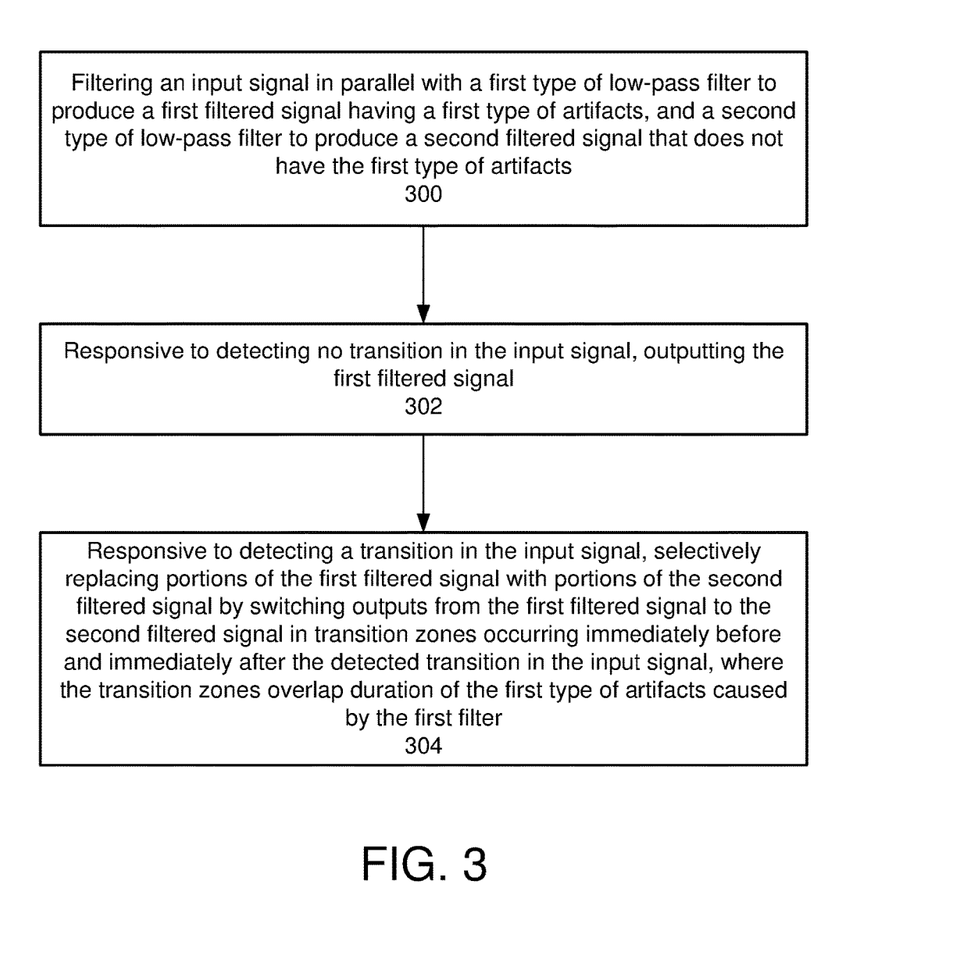
FIG. 3 is a flow diagram illustrating the process performed by the combination low pass filter for reducing bandwidth of an input signal, according to an exemplary embodiment.

FIG. 3 is a flow diagram illustrating the process performed by the combination low pass filter 200 for reducing bandwidth of an input signal, according to an exemplary embodiment. The process may begin by filtering the input signal 206, preferably in parallel, with the first type of low-pass filter (hereinafter "first filter" or "filter F1") to produce a first filtered signal having a first type of artifacts, and the second type of low-pass filter (hereinafter "second filter" or "filter F2") to produce a second filtered signal that does not have the first type artifacts (block 300). Although the second filtered signal does not include the first type of artifacts, it should be understood that the second filtered signal may have a second type of artifacts different from the first type of artifacts.

In one embodiment, the first filter and the second filter are preferably configured to have substantially the same (if not identical) cutoff frequencies. Both the first filtered signal 208 and the second filtered signal 210 have reduced bandwidth compared to the input signal 206.

FIGS. 4A-4F are graphs illustrating time domain responses of the input signal 206, the F1 filtered signal 208, the F2 filtered signal 210, and combinations thereof, where the x-axis represents time and the y-axis represents amplitude. Note, the signals shown in FIGS. 4A-4F are not to scale and are shown for explanatory purposes only.

Figure 4A:
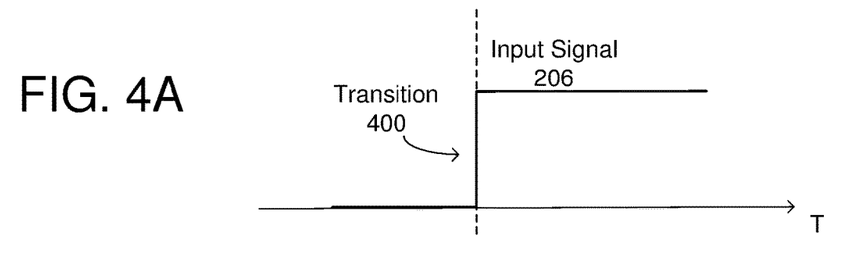
FIG. 4A is a graph illustrating a time domain response of the input signal.

FIG. 4A is a graph illustrating a time domain response of the input signal 206. In this example, the input signal 206 includes a sharp transition 400, such as a video image having an abrupt change between white and black, for example. The input signal 206 may represent any type of data, including but not limited to, image, video, and music data. In this sense, although the exemplary embodiments may be described in terms of a transition in a video signal, the term transition is meant to also include abrupt changes that may be detected in audio signals and other forms of data signals.

Figure 4B:
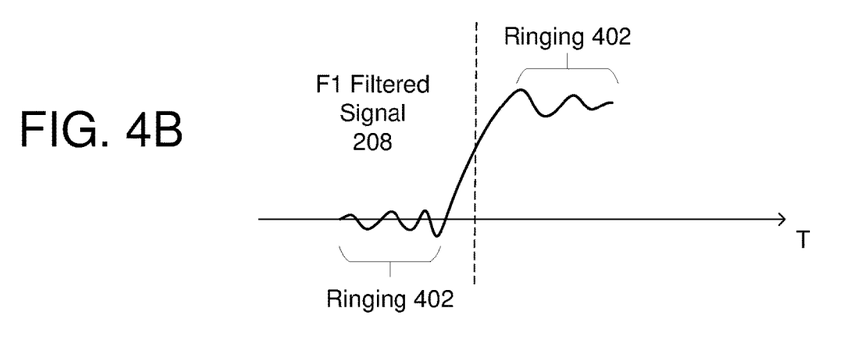
FIG. 4B is a time domain response of the F1 filtered signal after processing by filter F1.

FIG. 4B is a time domain response of the F1 filtered signal 208 after processing by filter F1. Filter F1 comprises a low-pass filter (e.g., a Brickwall filter) that produces an F1 filtered signal 208 with ringing 402 parts immediately before and immediately after the transition 400. This occurs when a wide bandwidth input yields an output with limited attenuation of low frequencies, excellent attenuation of high frequencies, and maintains a minimal duration of the transition, but is surrounded by undesirable ringing artifacts. The term "ringing" refers to the fact that the F1 filtered signal oscillates at a fading rate around the transition 400 in the input signal 206. Ringing artifacts appear as spurious signals near significant transitions 400 in the input signal 206. In video signals, ringing 402 appears visually as bands or "echoes" near edges; while in audio signals, ringing 402 appears as audible "echoes" near transients, particularly sounds from percussion instruments.

Figure 4C:
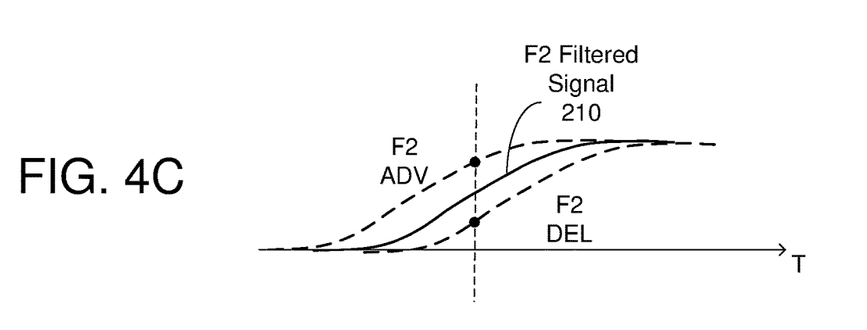
FIG. 4C is a time domain response of the F2 filtered signal after processing by filter F2.

FIG. 4C is a time domain response of the F2 filtered signal 210 after processing by filter F2. Per configuration of filter F2, the F2 filtered signal 210 has no ringing, but at the cost of frequency domain performance—rolling off in the passband, and insufficient reduction of the high frequencies in the stopband, which for an image signal, "blurs" the image. The F2 filtered signal 210 is also represented in FIG. 4C by time altered forms or versions of the F2 filtered signal 210, referred to herein as F2 advanced (F2 ADV) and F2 delayed (F2 DEL), explained further below.

Figure 4D:
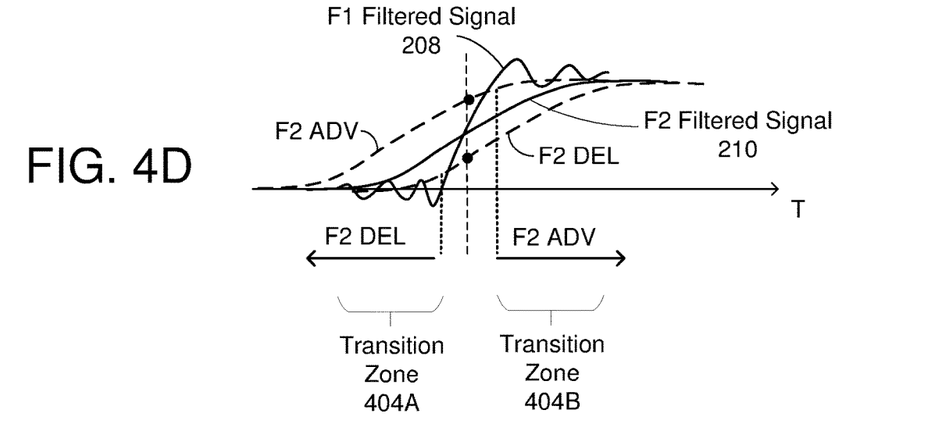
FIG. 4D is a time domain response of the F1 filtered signal superimposed with the F2 filtered signal and F2's time altered forms.

FIG. 4D is a time domain response of the F1 filtered signal 208 (F1) superimposed with the F2 filtered signal 210 (F2) and F2's time altered forms, all centered on the transition 400. It should be noted that the combination low pass filter 300 does not actually combine signals F1 and F2 together as shown. Rather FIG. 4D is provided only for explanatory purposes.

Referring again to FIG. 3, the combiner switch 204 receives the F1 filtered signal 208 and the F2 filtered signal 210 as input. According to the exemplary embodiments, the combiner switch 204 selectively switches between the F1 filtered signal 208 and the F2 filtered signal 210 to generate a final output signal 316 having significantly reduced artifacts. More specifically, responsive to detecting no significant transition in the input signal 206, the combiner switch 204 outputs the first filtered signal 208 (block 302). Responsive to detecting a significant transition in the input signal 206, the combiner switch 204 selectively replaces portions of the first filtered signal 208 with portions of the second filtered signal 210 by switching outputs from the first filtered signal 208 to the second filtered signal 210 in transition zones occurring immediately before and immediately after the detected transition in the input signal, where the transition zones overlap duration of ringing 402 caused by the first filter (block 304). In an alternative embodiment, the combiner switch 204 may be configured to continuously output the first filtered signal 208 as the final filtered signal 216 except when a transition is detected, which causes block 304 to be performed.

Figure 4E:
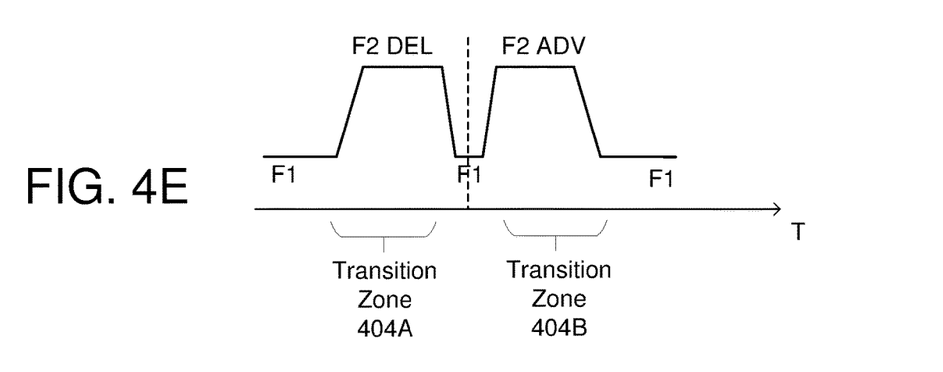
FIG. 4E is a time domain representation of the switch timing between the F1 filtered signal and forms of the F2 filtered signal.
Figure 4F:
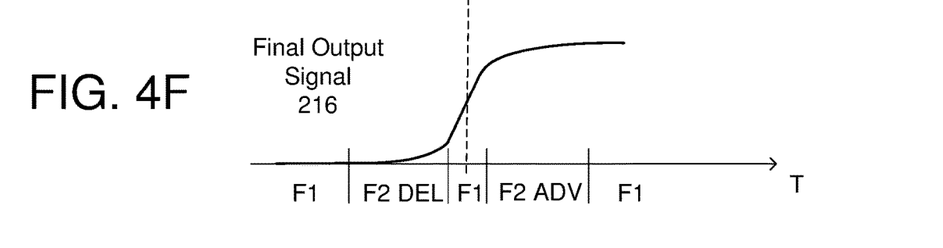
FIG. 4F is a time domain representation of the final output signal.

FIG. 4F is a time domain response of the final output signal. In the final output signal 216, the ringing portions of the F1 filtered signal are replaced by a slow slope from the F2 filtered signal 200, where the slope is limited in amplitude, but the final output signal 216 has a fast rise time.

According to the exemplary embodiments, the result of the process of switching between outputs of a fast Brickwall-type low-pass filter and a slow, ringing free low-pass filter having the same cutoff frequencies is a final output signal 216 having roll-off characteristics of the first low-pass filter, but without ringing. The final output signal 216 has advantages over conventional output signals generated by only one type of low pass filter because any error in the final output signal 216 is not very visible, or not very damaging to the data, unlike ringing, and the final output signal 216 is not "blurred" as it would be by a Gaussian-type filter. Further details of the exemplary embodiments are provided below.

Of critical importance is that the final output signal 216 is generated such that there are no discontinuities, which means the switching back and forth between the F1 filtered signal 208 and the F2 filtered signal 210 must be timed properly. According to one aspect of exemplary embodiment, this is accomplished by switching between with the F1 filtered signal 208 and the time altered versions of the F2 filtered signal 210—F2 advanced (F2 ADV) and F2 delayed (F2 DEL) shown in FIGS. 4C-4E, rather than using the F2 filtered signal 210 directly. The purpose of replacing portions of the F1 filtered signal 208 in the transition zones covering the ringing 400 with corresponding time altered portions of the F2 filtered signal 210 is to prevent perceptible discontinuities in the final output signal. This requires calculation of the transition zones as well as generation of F2 advanced and F2 delayed.

Referring again to FIG. 2, according to one embodiment, the transition detector 202 may be configured to both detect the presence of transitions in the input signal 206 as well as to define the transition zones, while the combiner switch 204 may be configured to generate the F2 advanced and F2 delayed signals.

In operation, the transition detector 202 receives the input signal 206 as input and analyzes the input signal 206 to detect any significant transitions 400 present in the input signal 206, based at least in part on input transition threshold(s) 212. The values for the input transition thresholds 212 are application dependent. The transition detector 202 outputs a transition signal 214 to the combiner switch 204 to switch outputs between the F1 filtered signal 208 and the F2 filtered signal 210 based on whether or not the transition signal 214 indicates the presence of a transition. In one embodiment, a significant transition is one that meets or exceeds the input transition threshold(s) 212. In one embodiment, transition thresholds 212 may not necessarily be discreet, but may represent a zone of variable width between low transitions (no visible ringing) and higher-level transitions (visible ringing).

Referring to FIG. 4B, the F1 filtered signal was described as having ringing 402. In further detail, the ringing artifacts comprise a first ringing part immediately preceding the transition and a second ringing part immediately following the transition. Referring to FIG. 4D, responsive to detecting a transition, the transition detector 202 may also define a transition zone 404 on each side of the transition 400 having a width that covers the duration of the respective ringing part, where the width is based at least in part on the amplitude of the transition and the expected duration of the ringing part. Therefore, the width of the transition zone 404A 404B is variable rather than constant. For example if the detected transition 400 is relatively small, then the width of the transition zone may be smaller than one corresponding to a transition in a video signal that goes from black to white, for instance. The transition detector 202 may transmit both the transition signal 214 and the transition zone 404 information to the combiner switch 204 as transitional information.

Figure 5:
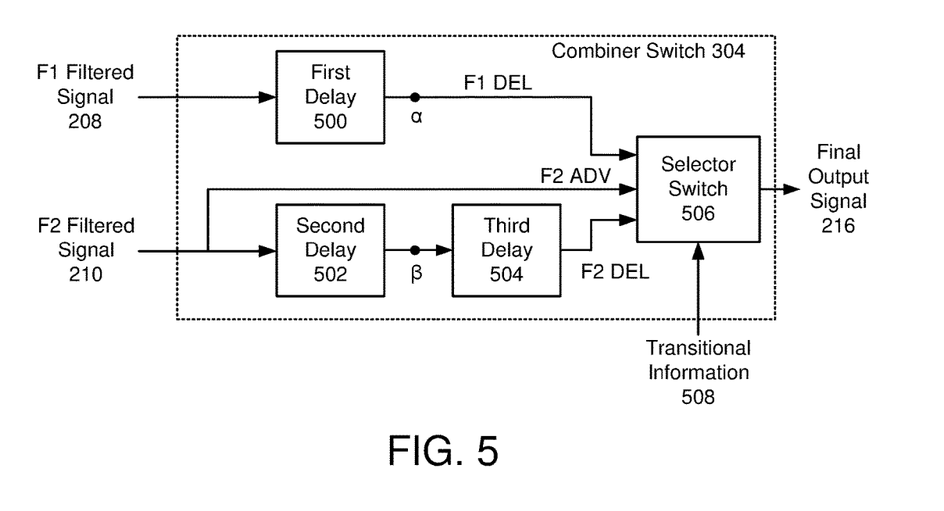
FIG. 5 is a block diagram illustrating the combiner switch in further detail.

FIG. 5 is a block diagram illustrating the combiner switch 304 in further detail. In one embodiment, the combiner switch 304 comprises first delay 500, second delay 502, third delay 504, and a selector switch 506. The purpose of the delays 500, 502 and 504 is for the combiner switch 304 to create slightly delayed and slightly advanced versions of the F2 filtered signal 210 relative to the F1 filtered signal 208. It should be noted that the term F2 advanced does not refer to a signal occurring in the future, but rather F2 advanced is created by delaying the other signals, as follows.

The F1 filtered signal 208 is processed by the first delay 500 to create an F1 delayed signal (F1 DEL) at point α. The F2 filtered signal 210 is processed by the second delay 502 to create an interim F2 delayed signal at point β. The purpose of the first delay 500 is to delay the F1 filtered signal 208 to match the second delay 502 of the F2 filtered signal 210. Thus, F1 delayed signal at point α is synchronous with the interim F2 delayed signal at point β. The first delay 500 and the second delay 502 may not be necessarily configured to have the same delay. For example, the F1 filtered signal 208 may be generated much faster than the F2 filtered signal 210 or vice versa. Therefore, the first delay 500 and the second delay 502 may have different functions that are configured to compensate for the errors of delays of the F1 filter and the F2 filter, but also to create delays to compensate to make the switching transition smooth.

One purpose of the second delay 502 is to create F2 advanced (F2 ADV) by directly inputting the F2 filtered signal 210 into the selector switch 506, bypassing the second delay 502. The interim F2 delayed signal at point β is processed again by the third delay 504 to create the actual F2 delayed signal (F2 DEL), which is delayed compared to the F1 delayed signal. In one embodiment, the delay performed by the second delay 502 and the third delay 504 may be equal.

The selector switch 506 receives as input the F1 filtered signal 208 (i.e. F1 DEL), the F2 advanced signal and the F2 delayed signal. Hereinafter, the term F1 filtered signal 208 is meant to refer to the F1 delayed signal for ease of discussion. The selector switch 506 further receives transitional information 508 comprising the transition signal 214 and transition zone information from the transition detector 212.

FIG. 4E is a time domain representation of the switch timing performed by the selector switch 506 to switch outputs between the F1 filtered signal 208 and the F2 advanced signal and the F2 delayed signal. When the transition signal 214 indicates an absence of a significant transition in the input signal 206, the switch selector 506 (and therefore the combiner switch 204) outputs the (delayed) F1 filtered signal 208 as the final output signal 316.

When the transition signal 214 indicates the presence of a significant transition in the input signal 206, the combiner switch 204 replaces portions of the F1 filtered signal 208 with portions of the F2 filtered signal 210 in transition zones of the input signal 206 occurring immediately before and immediately after the detected transition. More specifically, the F2 delayed signal is output during the first transition zone 404A to replace the first ringing part of the F1 filtered signal 208; the F1 filtered signal 208 is output in between the first transition zone 404A and the second transition zone 404B; and the F2 advanced signal is output during the second transition zone 404B to replace the second ringing part of the F1 filtered signal 208. After the second transition zone 404B the transition ceases to be detected, causing the F1 filtered signal 208 to be output until the next detected transition.

In FIG. 4E, the lines that separate the output between F1 and the time delayed forms of F2 are not vertical, meaning that soft or gradual switching between F1 and F2 is performed. Accordingly, the term "switching" is used herein in a general sense. There is nowhere a sudden switching of signals, but rather a multiplicative process, where the changes required to not introduce artifacts.

The exemplary embodiments have disclosed a combination low-pass filter, which combines a first type of low-pass filter (e.g., a Brickwall filter) and a second filter comprising a slow, ringing free low-pass filter to produce a final output signal having fast roll-off characteristics of the Brickwall filter but without ringing. The final output signal is generated such that the presence of a transition, the output of the first filter is replaced for a short intervals of time by time delayed forms of the second filter before and after the transition. These intervals of time overlap duration of ringing produced by the first filter, and the switching between the output of first filter and the time delayed forms of the second filter are gradual. The time delayed forms of the signal output by the second filter are advanced and delayed, and the choice of the advance and delay values around the transition are such that the final output signal does not present any discontinuity and original ringing produced the first filter is significantly reduced, with only a negligible increase of the transition rise time.

The present invention has been described in accordance with the embodiments shown, and there could be variations to the embodiments, and any variations would be within the spirit and scope of the present invention. For example, referring again to FIG. 2, the components of the combination low pass filter 200, i.e., the fast low-pass filter F1, the slow low-pass filter F2, the transition detector 202, and the combiner switch 304 may be implemented as software components. In another embodiment, the components could be implemented as a combination of hardware and software. Although the transition detector 202 and the combiner switch 204 are shown as separate components, the functionality of each may be combined into a lesser or greater number of modules/components. In addition, for the hardware embodiment, although direct connections are shown between filters F1, F2, the transition detector and the combiner switch 204, nothing prevents connections to intervening components.

For the software embodiment, the components of the combination low pass filter 200 may be run on any type of one more computers that have memory and processor. For the hardware embodiment, the components of the combination low pass filter 200 may be coupled to any type of one more computers that have memory and processor. One or more computers may include hardware components of typical computing devices (not shown), including a processor, input devices (e.g., keyboard, pointing device, microphone for voice commands, buttons, touchscreen, etc.), and output devices (e.g., a display device, speakers, and the like). The computer(s) may include computer-readable media, e.g., memory and storage devices (e.g., flash memory, hard drive, optical disk drive, magnetic disk drive, and the like) containing computer instructions that implement the functionality disclosed when executed by the processor. The computer(s) may further include wired or wireless network communication interfaces for communication.

Thus, the exemplary embodiments can be implemented using hardware, software, a computer readable medium containing program instructions, or a combination thereof. Software written according to the present invention is to be either stored in some form of computer-readable medium such as a memory, a hard disk, or a CD/DVD-ROM and is to be executed by a processor. Accordingly, many modifications may be made by one of ordinary skill in the art without departing from the spirit and scope of the appended claims.

I claim:

1. A method for reducing bandwidth of an input signal, comprising:
    filtering an input signal in parallel with a first type of low-pass filter to produce a first filtered signal having a first type of artifacts, and a second type of low-pass filter to produce a second filtered signal that does not include the first type of artifacts;
    responsive to detecting no significant transition in the input signal, outputting the first filtered signal; and
    responsive to detecting a significant transition in the input signal, selectively replacing portions of the first filtered signal with portions of the second filtered signal by switching outputs from the first filtered signal to the second filtered signal in transition zones occurring immediately before and immediately after the detected transition in the input signal, wherein the transition zones overlap duration of the first type of artifacts caused by the first filter.

2. The method of claim 1, further comprising:
analyzing the input signal using a transition detector to detect any significant transitions present in the input signal and outputting a transition signal; and
receiving as input by a combiner switch, the transition signal, the first filtered signal and the second filter signal; and
switching outputs, by the combiner switch, between the first filtered signal and the second filtered signal based on whether or not the transition signal indicates a presence of a transition.

3. The method of claim 2, wherein the transition detector detects any significant transitions present in the input signal based at least in part on an input transition threshold.

4. The method of claim 2, wherein the first type of artifacts are ringing artifacts that comprise a first ringing part immediately preceding the transition and a second ringing part immediately following the transition, the method further comprising:
responsive to detecting a transition, defining by the transition detector a transition zone on each side of the transition having a variable width that covers the duration of the respective ringing part, where the width is based at least in part on the amplitude of the transition and an expected duration of the respective ringing part.

5. The method of claim 4, further comprising: transmitting by the transition detector both the transition signal and transition zone information comprising the defined transition zones to the combiner switch as transitional information.

6. The method of claim 1, further comprising:
creating time altered versions of the second filtered signal; and
when a transition is detected in the input signal, switching outputs from the first filtered signal to time altered versions of the second filtered signal to prevent perceptible discontinuities in the final output signal.

7. The method of claim 6, wherein time altered versions of the second filtered signal comprise an F2 delayed signal and an F2 advanced signal, and wherein the first type of artifacts comprise ringing, the method further comprising:
when a significant transition is detected in the input signal:
outputting the F2 delayed signal in a first transition zone to replace a first ringing part of the first filtered signal;
outputting the first filtered signal in between the first transition zone and the second transition zone; and
outputting the F2 advanced signal during a second transition zone to replace a second ringing part of the first filtered signal.

8. The method of claim 1, wherein the first type of low-pass filter and the second type of low-pass filter have substantially similar cutoff frequencies.

9. The method of claim 1, wherein the first type of low-pass filter comprises a Brickwall filter and the second type of low-pass filter comprises a Gaussian filter.

10. A combination low-pass filter, comprising:
a first type of low-pass filter that filters an input signal to produce a first filtered signal having a first type of artifacts;
a second type of low-pass filter that filters the input signal produce a second filtered signal that does not include the first type of artifacts; and
a combiner switch that responsive to no significant transition being detected in the input signal, outputs the first filtered signal, and responsive to a significant transition being detected in the input signal, selectively replaces portions of the first filtered signal with portions of the second filtered signal by switching outputs from the first filtered signal to the second filtered signal in transition zones occurring immediately before and immediately after the detected transition in the input signal, wherein the transition zones overlap duration of the first type of artifacts caused by the first filter.

11. The combination low-pass filter of claim 10, further comprising:
a transition detector that analyzes the input signal to detect significant transitions in the input signal and outputs a transition signal and outputting a transition signal;
wherein the combiner switch receives the transition signal, the first filtered signal and the second filter signal, and switches outputs between the first filtered signal and the second filtered signal based on whether or not the transition signal indicates a presence of a transition.

12. The combination low pass filter of claim 11, wherein the transition detector detects any significant transitions present in the input signal based at least in part on an input transition threshold.

13. The combination low pass filter of claim 11, wherein the first type of artifacts are ringing artifacts that comprise a first ringing part immediately preceding the transition and a second ringing part immediately following the transition, wherein responsive to detecting a transition, the transition detector defines a transition zone on each side of the transition having a variable width that covers the duration of the respective ringing part, where the width is based at least in part on the amplitude of the transition and an expected duration of the respective ringing part.

14. The combination low pass filter of claim 13, further comprising: transmitting by the transition detector both the transition signal and the transition zone information comprising the defined transition zones to the combiner switch as transitional information.

15. The combination low pass filter of claim 10, wherein the combiner switch creates time altered versions of the second filtered signal, and wherein when a transition is detected in the input signal, the combiner switch switches outputs from the first filtered signal to time altered versions of the second filtered signal to prevent perceptible discontinuities in the final output signal.

16. The combination low pass filter of claim 15, wherein time altered versions of the second filtered signal comprise an F2 delayed signal and an F2 advanced signal, and wherein the first type of artifacts comprise ringing, and wherein:
when a significant transition is detected in the input signal:
the combiner switch outputs the F2 delayed signal in a first transition zone to replace a first ringing part of the first filtered signal;
the combiner switch outputs the first filtered signal in between the first transition zone and the second transition zone; and
the combiner switch outputs the F2 advanced signal during a second transition zone to replace a second ringing part of the first filtered signal.

17. The combination low pass filter of claim 10, wherein the first type of low-pass filter and the second type of low-pass filter have substantially similar cutoff frequencies.

18. The combination low pass filter of claim 10, wherein the first type of low-pass filter comprises a Brickwall filter and the second type of low-pass filter comprises a Gaussian filter.

19. A method for reducing bandwidth of an input signal, comprising:
   filtering the input signal with a first low-pass filter to produce a first filtered signal, wherein in presence of a transition in the input signal, the first filtered signal comprises a first ringing part immediately preceding the transition and a second ringing part immediately following the transition;
   filtering the input signal with a second low-pass filter to produce time altered versions of a second filtered signal, wherein the time altered versions of the second filtered signal have an absence of ringing parts;
   detecting a transition in the input signal; and
   automatically switching between the first filtered signal and the second filtered signal to generate a final output signal having significantly reduced artifacts, wherein the switching comprises:
      outputting the first filtered signal in absence of detecting a significant transition in the input signal; and
      when the transition signal indicates a significant transition in the input signal:
         replacing the first ringing part of the first filtered signal with a corresponding first time altered version of the second filtered signal; and
         replacing the second ringing part of the first filtered signal with a corresponding a second time altered version of the second filtered signal.

20. A non-transitory computer-readable medium containing program instructions for reducing bandwidth of an input signal, the program instructions for:
   filtering an input signal in parallel with a first type of low-pass filter to produce a first filtered signal having ringing artifacts, and a second type of low-pass filter to produce a second filtered signal that does not include the first type of artifacts;
   responsive to detecting no significant transition in the input signal, outputting the first filtered signal; and
   responsive to detecting a significant transition in the input signal, selectively replacing portions of the first filtered signal with portions of the second filtered signal by switching outputs from the first filtered signal to the second filtered signal in transition zones occurring immediately before and immediately after the detected transition in the input signal, wherein the transition zones overlap duration of the first type of artifacts caused by the first filter.

* * * * *